United States Patent
Cheng et al.

(10) Patent No.: US 11,408,938 B2
(45) Date of Patent: Aug. 9, 2022

(54) BIDIRECTIONAL SCAN CELLS FOR SINGLE-PATH REVERSIBLE SCAN CHAINS

(71) Applicant: Siemens Industry Software Inc., Plano, TX (US)

(72) Inventors: Wu-Tung Cheng, Lake Oswego, OR (US); Yu Huang, West Linn, OR (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/415,872

(22) PCT Filed: Feb. 11, 2020

(86) PCT No.: PCT/US2020/017642
§ 371 (c)(1),
(2) Date: Jun. 18, 2021

(87) PCT Pub. No.: WO2020/167753
PCT Pub. Date: Aug. 20, 2020

(65) Prior Publication Data
US 2022/0043062 A1    Feb. 10, 2022

Related U.S. Application Data

(60) Provisional application No. 62/837,218, filed on Apr. 23, 2019, provisional application No. 62/804,320, filed on Feb. 12, 2019.

(51) Int. Cl.
*G01R 31/3185* (2006.01)
*G01R 31/3177* (2006.01)

(52) U.S. Cl.
CPC . *G01R 31/318536* (2013.01); *G01R 31/3177* (2013.01); *G01R 31/318541* (2013.01);
(Continued)

(58) Field of Classification Search
CPC .... G01R 31/318536; G01R 31/318541; G01R 31/318555; G01R 31/318572; G01R 31/3177
(Continued)

(56) References Cited

U.S. PATENT DOCUMENTS 5,202,625 A    4/1993  Farwell
6,125,464 A *  9/2000  Jin ................. G01R 31/318572
                                                    714/724
(Continued)

FOREIGN PATENT DOCUMENTS

WO    2014124571 A1    8/2014

OTHER PUBLICATIONS

Anonymous, A Bi-Directional Scan for Higher Controllability and Observability, Oct. 24, 2006, An IP.com Prior Art Database Technical Disclosure, IP.com No. IPCOM000142187D, pp. 1-4. (Year: 2006).*

(Continued)

*Primary Examiner* — John J Tabone, Jr.

(57) ABSTRACT

A circuit comprises a plurality of scan chains. The plurality of scan chains comprises bidirectional scan cells. Each of the bidirectional scan cells comprises two serial input-output ports serving as either a serial data input port or a serial data output port based on a control signal. Each of the plurality of scan chains is configured to perform a shift operation in either a first direction or a second direction based on the control signal. The first direction is opposite to the second direction.

19 Claims, 8 Drawing Sheets

(52) U.S. Cl.
CPC ............ *G01R 31/318555* (2013.01); *G01R 31/318572* (2013.01)

(58) Field of Classification Search
USPC ..................................... 714/727, 726, 729
See application file for complete search history.

(56) References Cited

U.S. PATENT DOCUMENTS

| | | | |
|---|---|---|---|
| 10,156,607 B2* | 12/2018 | Goel | G01R 31/318536 |
| 11,073,556 B2* | 7/2021 | Cheng | G06F 30/333 |
| 2003/0173991 A1 | 9/2003 | Takafuji et al. | |
| 2009/0089637 A1* | 4/2009 | Jun | G01R 31/318541 |
| | | | 714/E11.024 |
| 2014/0223247 A1* | 8/2014 | Rajski | G01R 31/318563 |
| | | | 714/726 |
| 2016/0372070 A1 | 12/2016 | Hu et al. | |
| 2020/0341057 A1* | 10/2020 | Cheng | G01R 31/31724 |

OTHER PUBLICATIONS

PCT International Search Report and Written Opinion of International Searching Authority dated May 28, 2020 corresponding to PCT International Application No. PCT/US2020/017642 filed Feb. 11, 2020.
Bidirectional Scan Chain for Digital Circuit Testing, IP.com, Nov. 21, 2007, pp. 1-5.
Peilin Song et al., "A Novel Scan Chain Diagnostics Technique Based on Light Emission from Leakage Current," ITC International Test Conference, IEEE 2004, pp. 140-147.

* cited by examiner

BIDIRECTIONAL SCAN CELLS FOR SINGLE-PATH REVERSIBLE SCAN CHAINS

RELATED APPLICATIONS

This application claims the benefit of both U.S. Provisional Patent Application No. 62/804,320, filed on Feb. 12, 2019, and U.S. Provisional Patent Application No. 62/837,218, filed on Apr. 23, 2019, which applications are incorporated entirely herein by reference.

FIELD OF THE DISCLOSED TECHNIQUES

The presently disclosed techniques relates to circuit testing. Various implementations of the disclosed techniques may be particularly useful for scan chain diagnosis.

BACKGROUND OF THE DISCLOSED TECHNIQUES

Building circuits on silicon as test chips can provide insight into how a new fabrication process works. Traditionally, semiconductor manufacturers relied mainly on SRAM (static random-access memory) test chips for ramping up, qualifying and monitoring new semiconductor fabrication processes. The transistor and circuit geometries used on an SRAM test chip, however, represent only a small fraction of the transistor and circuit geometries found in a real product. In recent years, test chips with logic circuit components (logic test chips hereinafter) are often utilized to supplement or replace SRAM test chips. While more closely representing chips with real circuit designs, the logic test chips are not as easily testable or diagnosable as the SRAM test chips.

To check whether a logic test chip is fabricated according to the design and to locate potential defects, scan testing is usually employed. In this technique, a series of known values (test stimuli or test pattern) are shifted-in (or loaded into) state elements called scan cells through their sequential inputs. These scan cells are interconnected into scan chains for scan testing. The shifting-in occurs by placing the integrated circuit in a special mode, known as shift mode, and then applying a series of clock pulses, called "shift pulses" or "shift clock pulses." Each shift clock pulse pushes a bit of test stimuli into a scan cell in each of the scan chains. This continues until all scan cells in the scan chains are filled with test pattern bits. Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" and stored in the scan cells. The circuit then returns to shift mode, and with each additional clock pulse, a bit of the test responses is pushed or shifted out as each bit of new test pattern is pushed or shifted in. The shifted out test responses are then compared with expected results to determine and locate any errors. Shift mode and capture mode together may be called as test mode.

Scan chains and their associated clock circuitry are themselves a major source of circuit failures. It has been reported that defects occurring on scan chains account for about 30% to 50% of all failing chips. Thus, scan chains need to be tested and diagnosed first. As discussed in detail below, faulty scan chains can be detected using relatively simple methods. Locating defective scan cells, however, are challenging. Physical failure analysis instruments, combined with a tester, are sometimes used to search for defective responses along scan chains. These hardware-based methods often rely on specially-designed scan chains and scan cells. While effective in isolating scan chain defects, the requirement of extra hardware may not be acceptable in many realistic products. Further, it is difficult to apply these methods to chips with embedded compression circuits without resorting to a bypass mode.

Software-based techniques use algorithmic diagnosis procedures to identify failing scan cells. It may run chain diagnosis with conventional scan chains with or without embedded compressions. The current software-based chain diagnosis techniques may be further classified into two categories: model-based algorithms and data-driven algorithms. In a model-based chain diagnosis process, fault models and pattern simulation are used. In a data-driven chain diagnosis process, signal profiling, filtering and edge detections are applied. Each category of algorithms has its own advantages and disadvantages. These two can also be combined to increase diagnosis resolution and accuracy. While conventional methods may achieve satisfactory results for a defect behaving exactly like a modeled fault (e.g. stuck-at-0 fault at a scan cell's output), a defect in a scan chain often exhibits un-modeled faulty behavior (e.g. intermittent faulty behavior). For the un-modeled faults, both the diagnostic accuracy and resolution could degrade significantly.

Using bidirectional scan chains (or reversible scan chains) to improve the chain diagnostic accuracy and resolution was first proposed by P. Song, "A New Scan Structure for Improving Scan Chain Diagnosis and Delay Fault Coverage," Proc. 9th IEEE North Atlantic Test Workshop (NATW), 2000, pp. 14-18. A similar technique was discussed by a paper published by Ip.com on Nov. 21, 2007, entitled "Bidirectional Scan Chain for Digital Circuit Testing." U.S. Pat. Nos. 9,222,978 and 10,156,607 also disclosed performing both forward and backward scan tests via reversible scan chains. The techniques in all of these disclosures share one characteristics: the two opposite scan paths for a scan chain are partially separated outside scan cells on the scan chain.

Figure 1:
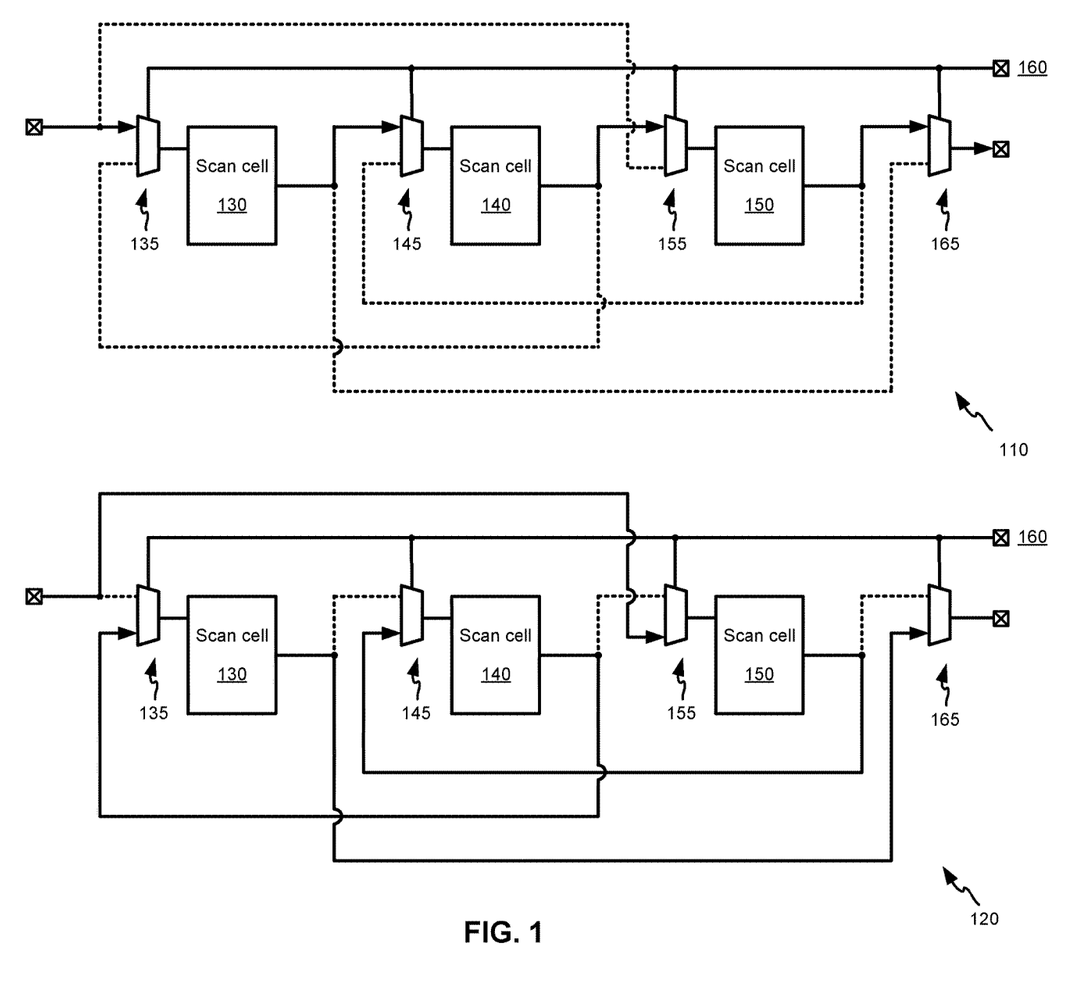
FIG. 1 illustrates an example of two block diagrams of a reversible scan chain comprising conventional scan cells which show two different scan directions, respectively.

FIG. 1 illustrates an example of two block diagrams 110 and 120 of a reversible scan chain according to these disclosed techniques. The scan chain comprises three scan cells 130, 140, 150 and four multiplexers 135, 145, 155, 165. A control signal supplied from a port 160 serves as the selection signal for the four multiplexers 135-165. In the block diagram 110, the control signal enables a scan path following a sequence of multiplexer 135—scan cell 130—multiplexer 145—scan cell 140—multiplexer 155—scan cell 150—multiplexer 165, shown by solid lines with arrows. In the block diagram 120, the control signal reverses and enables a different scan path multiplexer 155—scan cell 150—multiplexer 145—scan cell 140—multiplexer 135—scan cell 130—multiplexer 165, shown by solid lines with arrows. The two paths do share common segments such as the one between multiplexer 135 and scan cell 130, but many other segments are unique for either the forward path or the backward path. The conventional architecture, while facilitating chain diagnosis, can introduce too much silicon area overhead and routing congestion.

BRIEF SUMMARY OF THE DISCLOSED TECHNIQUES

Various aspects of the disclosed technology relate to chain testing and diagnosing in a reversible scan architecture. In one aspect, there is a circuit comprising: circuit, comprising:

a plurality of scan chains comprising bidirectional scan cells, each of the bidirectional scan cells comprising two serial input-output ports serving as either a serial data input port or a serial data output port based on a control signal, each of the plurality of scan chains configured to perform a shift operation in either a first direction or a second direction based on the control signal, the first direction being opposite to the second direction.

Each of the bidirectional scan cells may further comprise two tri-state buffers, outputs of the two tri-state buffers coupled to the two serial input-output ports of the each of the bidirectional scan cells, respectively, and the two tri-state buffers controlled by the control signal and inversion of the control signal, respectively. The two tri-state buffers may be in a demultiplexer. Each of the scan cells may still further comprise a multiplexer, two inputs of the multiplexer coupled to outputs of the two tri-state buffers, respectively. Each of the scan cells may still further comprise a conventional scan cell, a serial output of the conventional scan cell is coupled to inputs of the two tri-state buffers.

Alternatively, each of the scan cells may further comprises a multiplexer and a demultiplexer, two outputs of the demultiplexer coupled to the two serial input-output ports, respectively, and two inputs of the multiplexer coupled to the two serial input-output ports, respectively.

Alternatively, each of the scan cells may further comprise a first pair of tri-state buffers and a second pair of tri-state buffers controlled by the control signal and inversion of the control signal, respectively, an output of one tri-state buffer in the first pair of tri-state buffers coupled to one of the two serial input-output ports, an output of one tri-state buffer in the second pair of tri-state buffers coupled to another one of the two serial input-output ports.

In another aspect, there are one or more computer-readable media storing computer-executable instructions for causing a computer to perform a method, the method comprising: creating a plurality of scan chains in a circuit design for testing a chip fabricated according to the circuit design, the plurality of scan chains comprising: bidirectional scan cells, each of the bidirectional scan cells comprising two serial input-output ports serving as either a serial data input port or a serial data output port based on a control signal, each of the plurality of scan chains configured to perform a shift operation in either a first direction or a second direction based on the control signal, the first direction being opposite to the second direction.

In still another aspect, there is a bidirectional scan cell, comprising: two serial input-output ports serving as either a serial data input port or a serial data output port based on a control signal; two tri-state buffers, outputs of the two tri-state buffers coupled to the two serial input-output ports, respectively, the two tri-state buffers controlled by the control signal and inversion of the control signal, respectively; and a state element, an output of the state element coupled to inputs of the two tri-state buffers.

The two tri-state buffers may be in a demultiplexer. The state element may be a flip-flop.

The bidirectional scan cell may further comprise a multiplexer, two inputs of the multiplexer coupled to outputs of the two tri-state buffers, respectively.

The bidirectional scan cell may further comprise two additional tri-state buffers, inputs of the two additional tri-state buffers coupled to the two serial input-output ports, respectively, the additional two tri-state buffers controlled by the control signal and inversion of the control signal, respectively.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed technology relate to chain testing and diagnosing in a reversible scan architecture. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "perform" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

As used in this application the singular forms "a," "an," and "the" include the plural forms unless the context clearly dictates otherwise. Additionally, the term "includes" means "comprises." Further, the term "coupled" encompasses mechanical, electrical, magnetic, optical, as well as other practical ways of coupling or linking items together, and does not exclude the presence of intermediate elements between the coupled items. Furthermore, as used herein, the term "and/or" means any one item or combination of items in the phrase.

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file, or failure report). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection, and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Figure 2A:
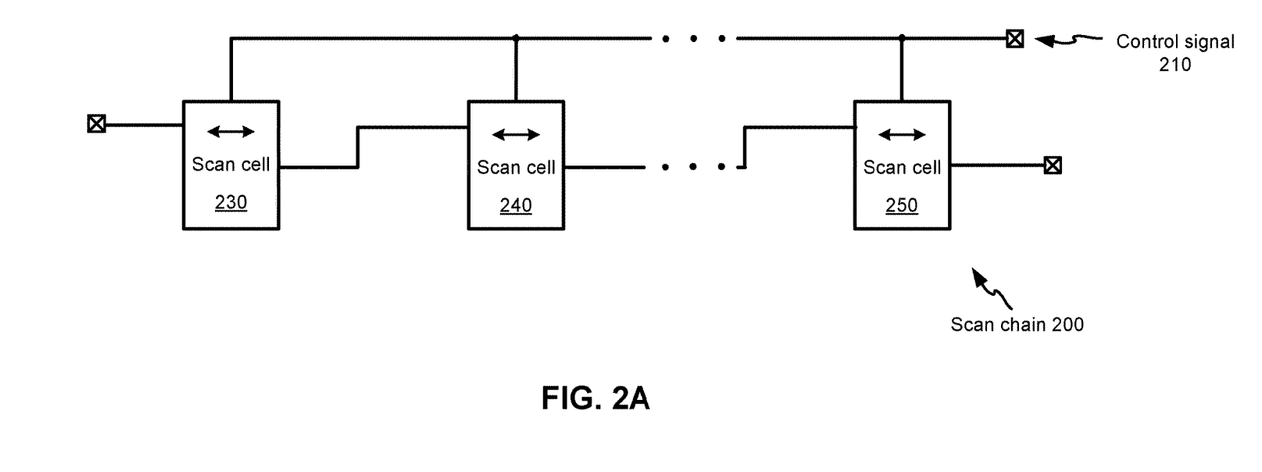
FIG. 2A illustrates an example of a reversible scan chain comprising bidirectional scan cells according to various embodiments of the disclosed technology.

FIG. 2A illustrates an example of a reversible scan chain 200 according to various embodiments of the disclosed technology. The reversible scan chain 200 comprises bidirectional scan cells 230, 240, . . . , and 250. Each of these bidirectional scan cells 230, 240, . . . , and 250 comprises two serial input-output ports configurable to serve as either a serial data input or a serial data output based on a control signal 210. As such, the reversible scan chain 200 can perform a shift operation in either a left-to-right direction or a right-to-left direction through the same scan path based on the control signal, rather than different paths used by the scan chain shown in FIG. 1. While the bidirectional scan cells 230, 240, . . . , and 250 may include more circuit components than a conventional scan cell, the multiplexers 135, 145, 155 and extra routings between scan cells shown in FIG. 1 are not needed. Moreover, a bidirectional scan cell can be designed and optimized to not be significantly larger than a conventional scan cell. Overall, the silicon area overhead increase (compared to conventional one-direction scan chains) introduced by single-path reversible scan chains implemented according to various embodiments of the disclosed technology can be smaller than that introduced by conventional two-path reversible scan chains.

Figure 2B:
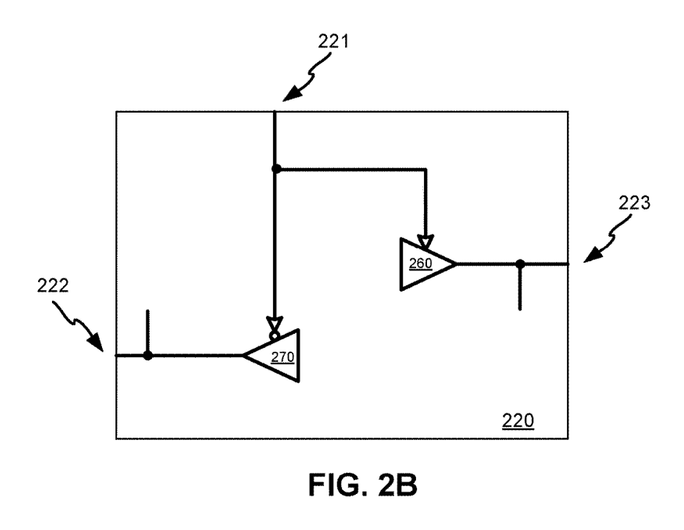
FIG. 2B illustrates an example of a block diagram of a bidirectional scan cell according to various embodiments of the disclosed technology

Each of the bidirectional scan cells 230, 240, . . . , and 250 may further comprise two tri-state buffers. A tri-state buffer is a device, of which an output port has three states: a high-impedance state, a logic 1 state, and a logic 0 state. The output port assuming the high impedance state effectively removes the output of the tri-state buffer from the circuit. Whether the output port assumes the logic 1 or 0 states depends upon the signal at the input port. A control signal at a control port of the tri-state buffer determines whether the output port assumes the high impedance state. FIG. 2B illustrates an example of a block diagram of such a bidirectional scan cell 220 according to various embodiments of the disclosed technology. The scan cell 220 comprises two tri-state buffers 260 and 270. The tri-state buffer 260 is controlled by a control signal 221 and the tri-state buffer 270 is controlled by inversion of the control signal 221. The outputs of the two tri-state buffers 260 and 270 are coupled to two serial input-output ports 223 and 222 of the bidirectional scan cell 220, respectively. When the control signal 210 is asserted, the tri-state buffer 270 assumes a high impedance state, allowing the serial input-output port 222 to serve as the serial input port of the bidirectional scan cell 220; when the control signal 210 is deasserted, the tri-state buffer 260 assumes a high impedance state, allowing the serial input-output port 223 to serve as the serial input port of the bidirectional scan cell 220. Each of the bidirectional scan cells 230, 240, . . . , and 250 may still further comprise a conventional scan cell. The serial output of the conventional scan cell is coupled to inputs of the two tri-state buffers.

Figure 3:
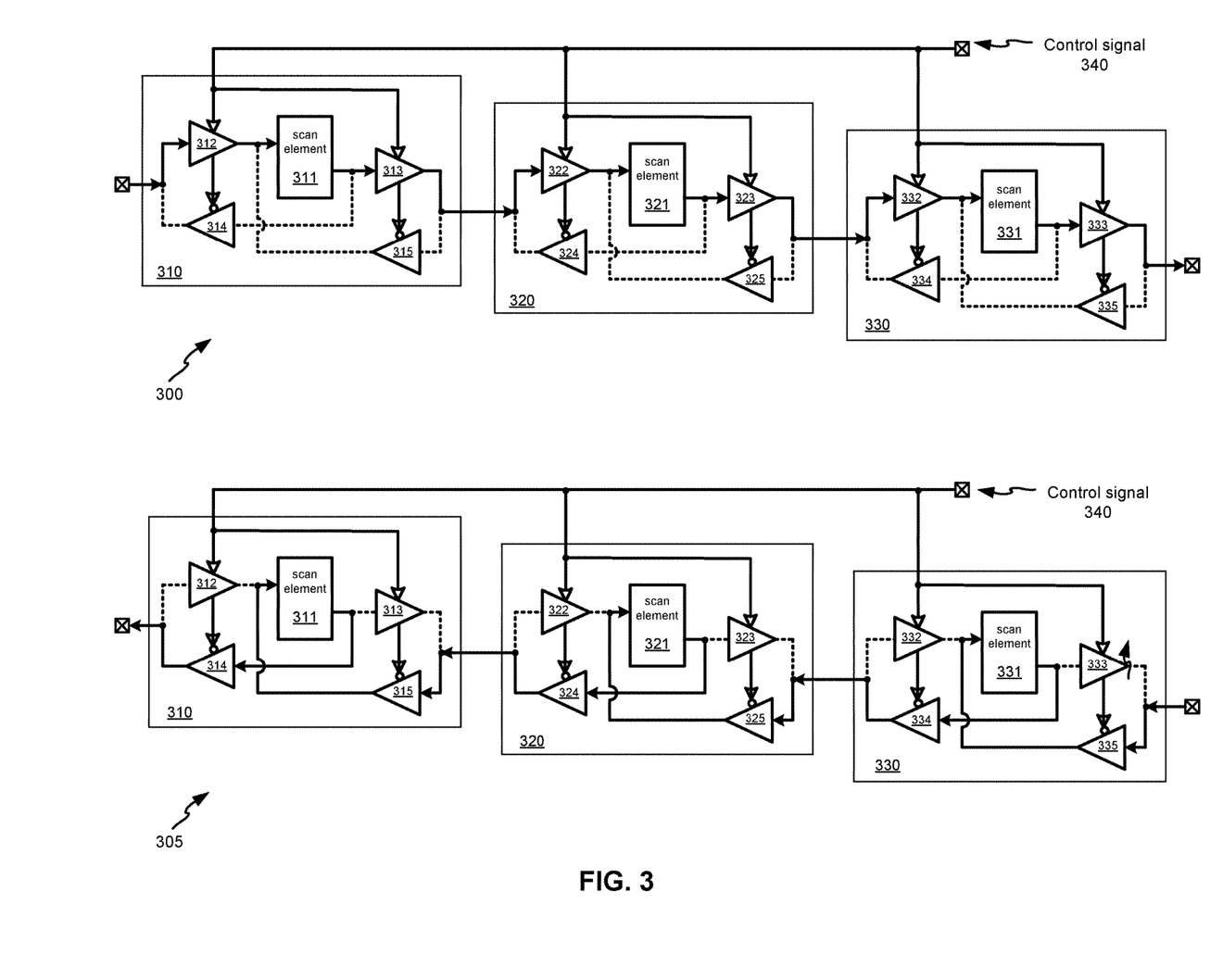
FIG. 3 illustrates an example of two block diagrams of a reversible scan chain for two different scan directions, respectively, according to various embodiments of the disclosed technology.

FIG. 3 illustrates an example of two block diagrams 300 and 305 of a reversible scan chain for two different scan directions, respectively, according to various embodiments of the disclosed technology. The reversible scan chain comprises three bidirectional scan cells 310, 320, 330. Each of the bidirectional scan cells 310, 320, 330 comprises a scan element (311, 321, 331), a pair of tri-state buffers (312/313, 322/323, 332/333) controlled by a control signal 340, and a pair of tri-state buffers (314/315, 324/325, 334/335) controlled by inversion of the control signal 340. Here, a scan element comprises a state element such as a flip-flop.

In the block diagram 300, the control signal 340 is asserted. The tri-state buffer pairs 312/313, 322/323, 332/333 are in a state allowing their outputs to follow their inputs, whereas the tri-state buffer pairs 314/315, 324/325, 334/335 are in a high impedance state which blocks their outputs. As such, the signal path in a shift operation follows a sequence of tri-state buffer 312—scan element 311—tri-state buffer 313—tri-state buffer 322—scan element 321—tri-state buffer 323—tri-state buffer 332—scan element 331—tri-state buffer 333. The direction of the shift operation is thus from left to right the control signal 340 is asserted.

In the block diagram 305, the control signal 340 is deasserted. The tri-state buffer pairs 314/315, 324/325, 334/335 are in a state allowing their outputs to follow their inputs, whereas the tri-state buffer pairs 312/313, 322/323, 332/333 are in a high impedance state which blocks their outputs. As such, the signal path in a shift operation follows a sequence of tri-state buffer 333—scan element 331—tri-state buffer 332—tri-state buffer 323—scan element 321—tri-state buffer 322—tri-state buffer 313—scan element 331—tri-state buffer 312. The direction of the shift operation is thus from right to left when the control signal 340 is deasserted.

Figure 4:
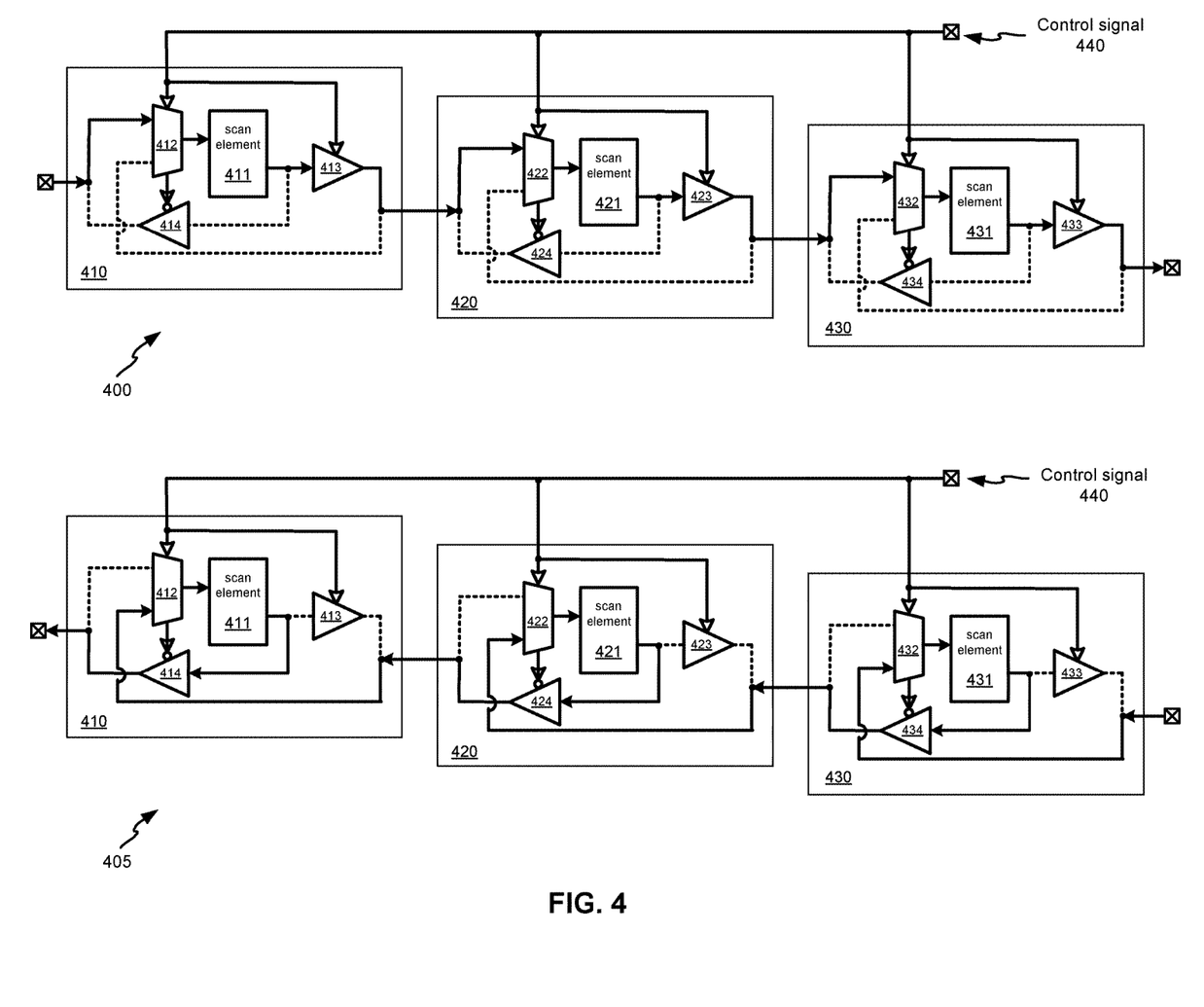
FIG. 4 illustrates another example of two block diagrams of a reversible scan chain for two different scan directions, respectively, according to various embodiments of the disclosed technology.

FIG. 4 illustrates another example of two block diagrams 400 and 405 of a reversible scan chain for two different scan directions, respectively, according to various embodiments of the disclosed technology. The reversible scan chain comprises three bidirectional scan cells 410, 420, 430. Each of the bidirectional scan cells 410, 420, 430 comprises a scan element (411, 421, 431), a tri-state buffer (413, 423, 433) controlled by a control signal 440, a tri-state buffer (414, 424, 434) controlled by inversion of the control signal 440, and a multiplexer (412, 422, 432) controlled by the control signal 440. Here, a scan element comprises a state element such as a flip-flop.

In the block diagram 400, the control signal 440 is asserted. The tri-state buffers 413, 423, 433 are in a state allowing their outputs to follow their inputs, whereas the tri-state buffers 414, 424, 434 are in a high impedance state which blocks their outputs. The multiplexers 412, 422, 432 select their first inputs (top inputs in the figure) for outputs. As such, the signal path in a shift operation follows a sequence of multiplexer 412—scan element 411—tri-state buffer 413—multiplexer 422—scan element 421—tri-state buffer 423—multiplexer 432—scan element 431—tri-state buffer 433. The direction of the shift operation is thus from left to right when the control signal 440 is asserted.

In the block diagram 405, the control signal 440 is deasserted. The tri-state buffers 414, 424, 434 are in a state allowing their outputs to follow their inputs, whereas the tri-state buffers 413, 423, 433 are in a high impedance state which blocks their outputs. The multiplexers 412, 422, 432 select their second inputs (bottom inputs in the figure) for outputs. As such, the signal path in a shift operation follows a sequence of multiplexer 432—scan element 431—tri-state buffer 434—multiplexer 422—scan element 421—tri-state buffer 424—multiplexer 412—scan element 411—tri-state buffer 414. The direction of the shift operation is thus from right to left when the control signal 440 is deasserted.

Figure 5A:
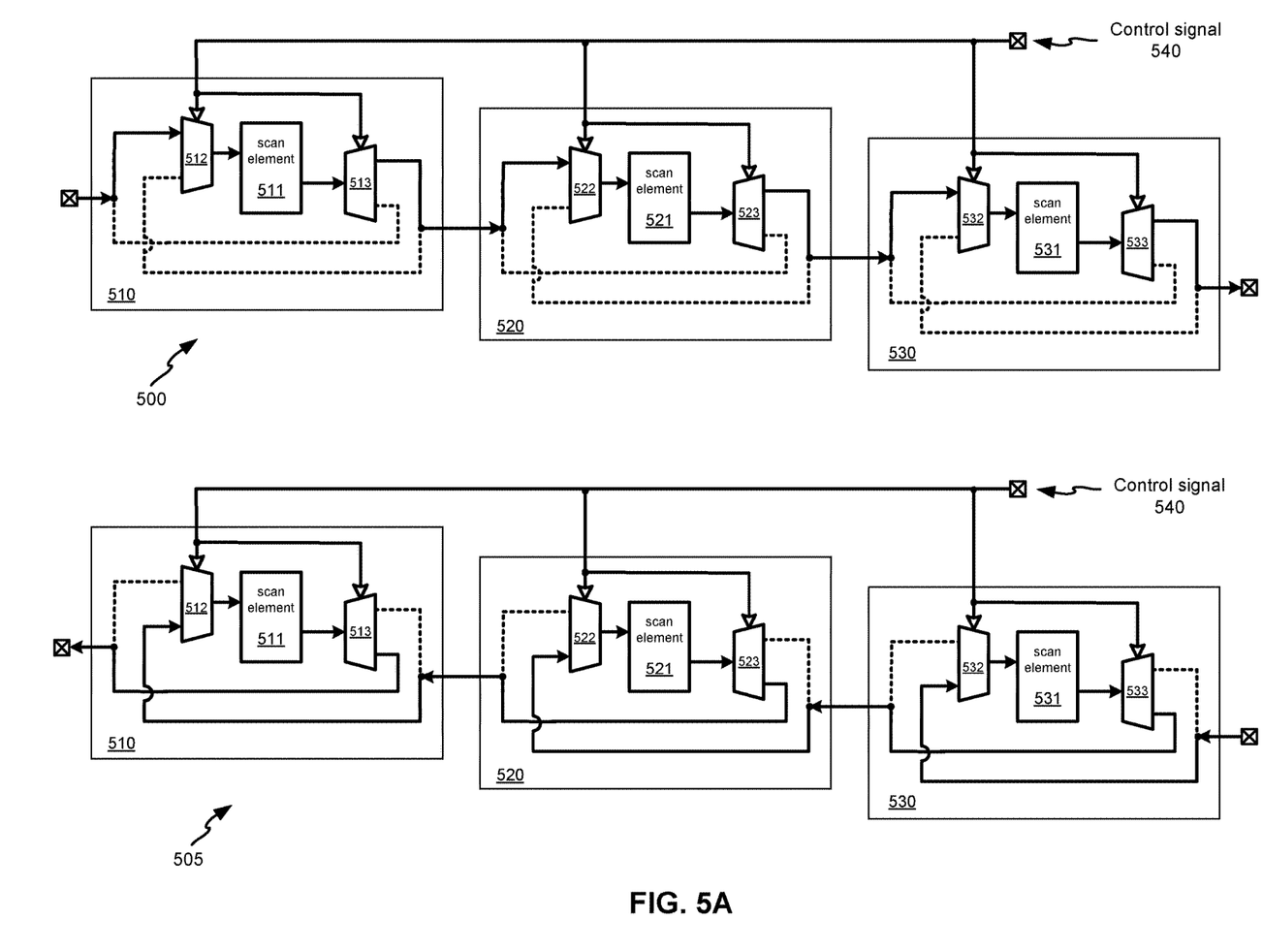
FIG. 5A illustrates still another example of two block diagrams of a reversible scan chain for two different scan directions, respectively, according to various embodiments of the disclosed technology.

FIG. 5A illustrates still another example of two block diagrams 500 and 505 of a reversible scan chain for two different scan directions, respectively, according to various embodiments of the disclosed technology. The reversible scan chain comprises three bidirectional scan cells 510, 520, 530. Each of the bidirectional scan cells 510, 520, 530 comprises a scan element (511, 521, 531), a multiplexer (512, 522, 532), and a demultiplexer (513, 523, 533). Both the multiplexer (512, 522, 532) and the demultiplexer (513, 523, 533) are controlled by a control signal 540. Here, a scan element comprises a state element such as a flip-flop.

In the block diagram 500, the control signal 540 is asserted. The multiplexers 512, 522, 532 select their first inputs (top inputs in the figure) for outputs, and the demultiplexers 513, 523, 533 output their input signals on their first outputs (top outputs in the figure). As such, the signal path in a shift operation follows a sequence of multiplexer 512—scan element 511—demultiplexer 513—multiplexer 522—scan element 521—demultiplexer 523—multiplexer 532—scan element 531—demultiplexer 533. The direction of the shift operation is thus from left to right when the control signal 540 is asserted.

In the block diagram 505, the control signal 540 is deasserted. The multiplexers 512, 522, 532 select their second inputs (bottom inputs in the figure) for outputs, and the demultiplexers 513, 523, 533 output their input signals on their second outputs (bottom outputs in the figure). As such, the signal path in a shift operation follows a sequence of multiplexer 532—scan element 531—demultiplexer 533—multiplexer 522—scan element 521—demultiplexer 523—multiplexer 512—scan element 511—demultiplexer 513. The direction of the shift operation is thus from left to right when the control signal 540 is deasserted.

Figure 5B:
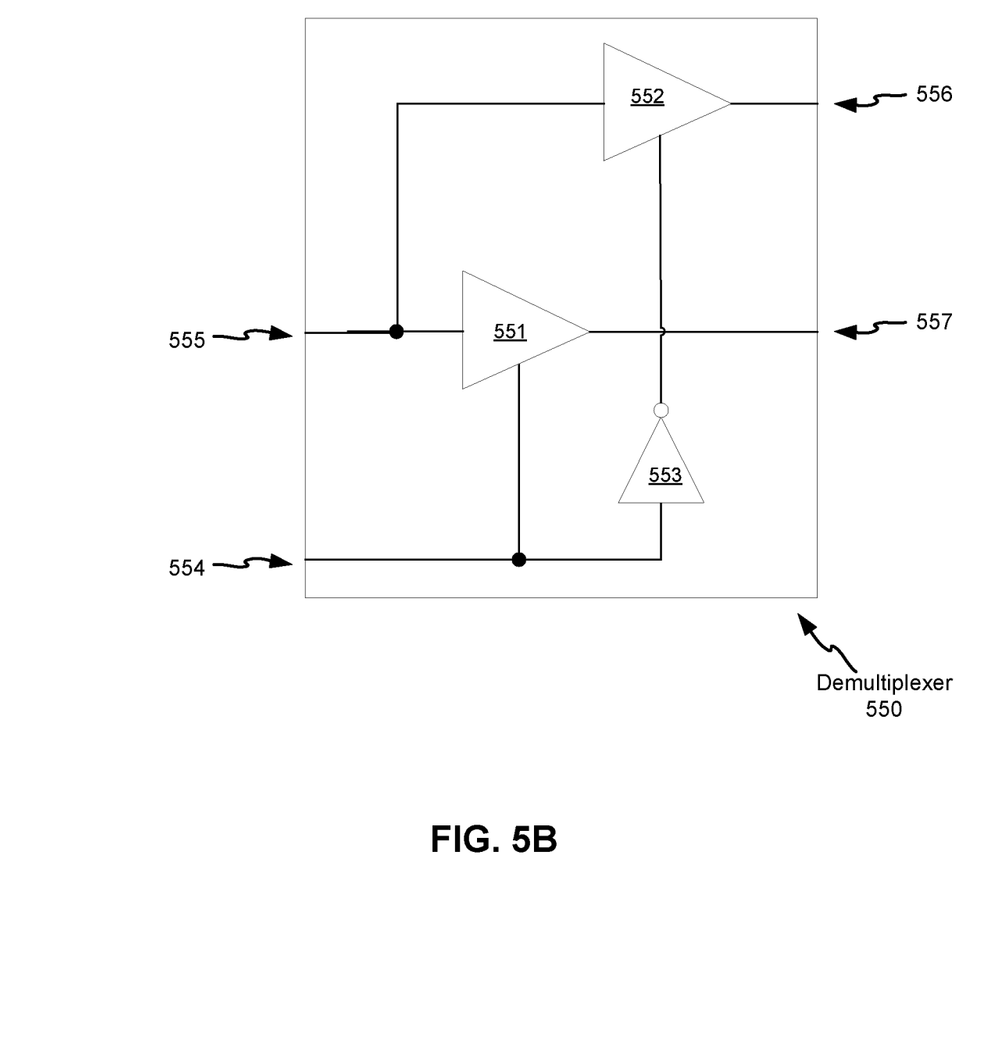
FIG. 5B illustrates an example of a block diagram of a demultiplexer that may be used in bidirectional scan cells in FIG. 5A according to various embodiments of the disclosed technology.

FIG. 5B illustrates an example of a block diagram of a demultiplexer 550 that may be used in bidirectional scan cells 510, 520, 530 in FIG. 5A according to various embodiments of the disclosed technology. The demultiplexer 550 comprises two tri-state buffers 551, 552 and an inverter 553. The signal input 555 of the demultiplexer 550 is coupled to both of the inputs of the tri-state buffer 551, 552; the first signal output 557 of the demultiplexer 550 is coupled to the output of the tri-state buffer 551; and the second signal output 556 of the demultiplexer 550 is coupled to the output of the tri-state buffer 552. A control signal supplied through the selection port 554 of the demultiplexer 550 controls the tri-state buffer 551 directly and the tri-state buffer 552 indirectly via the inverter 553. When the control signal is asserted, the tri-state buffer 551 is in a state allowing the first input 557 to follow the input 555 while the tri-state buffer 552 is in a high impedance state which blocks the second output 556. When the control signal is deasserted, the tri-state buffer 552 is in a state allowing the second input 556 to follow the input 555 while the tri-state buffer 551 is in a high impedance state which blocks the first output 557.

The parallel data input and output for each of the bidirectional scan cells shown in FIGS. 3, 4, 5A are not shown for ease of illustration. A multiplexer can be placed immediately before the data input of a flip-flop in the bidirectional scan cell for selecting either serial data input or parallel data input, and the output of the flip-flop can be directly coupled to the functional circuit. A person of ordinary skill in the art would appreciate that the scan elements in the bidirectional scan cells shown in FIGS. 3, 4, 5A may be conventional single-direction scan cells. A person of ordinary skill in the art would also appreciate that while only three bidirectional scan cells are shown in each of FIGS. 3, 4, 5A, the disclosed technology can be applicable to scan chains contain various numbers of bidirectional scan cells.

Figure 6A:
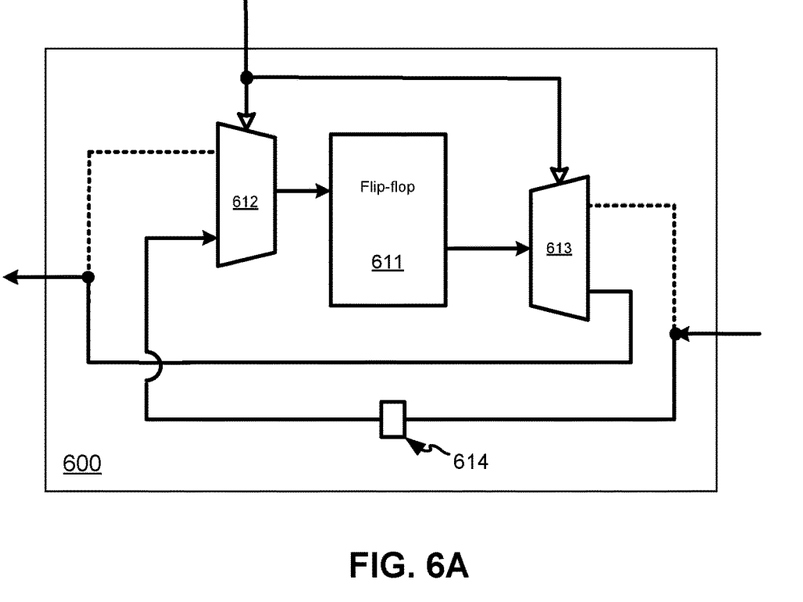
FIG. 6A illustrates an example of a pipeline cell being inserted into a bidirectional scan cell for one scan direction.
Figure 6B:
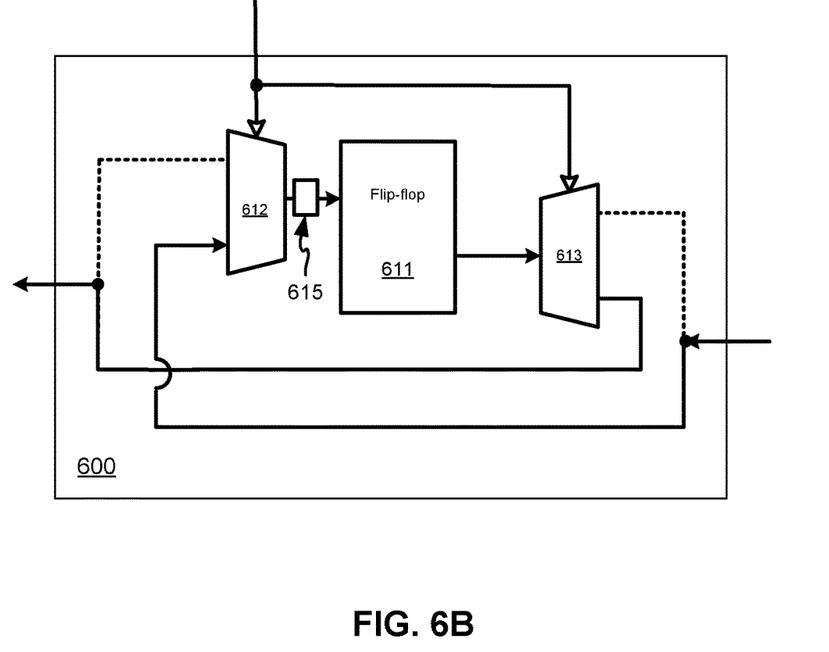
FIG. 6B illustrates an example of a pipeline cell being inserted into a bidirectional scan cell for both scan directions.

A pipeline cell can be inserted into a bidirectional scan cell for one scan direction or both scan directions. FIG. 6A illustrates an example of a pipeline cell 614 being inserted into a bidirectional scan cell 600 for one scan direction. The bidirectional scan cell 600 comprises a multiplexer 612, a flip-flop 611, and a demultiplexer 613. The pipeline cell 614 is inserted between the second output of the demultiplexer 613 and the second input of the multiplexer 612. As a result, the pipeline cell 614 is functional for the scan direction from right to left. FIG. 6B illustrates an example of a pipeline cell 615 being inserted into a bidirectional scan cell 600 for both scan directions. Specifically, the pipeline cell 615 is inserted between the output of the multiplexer 612 and the input of the flip-flop 611. As a result, the pipeline cell 615 is functional for both the scan direction from right to left and the scan direction from left to right.

Figure 7:
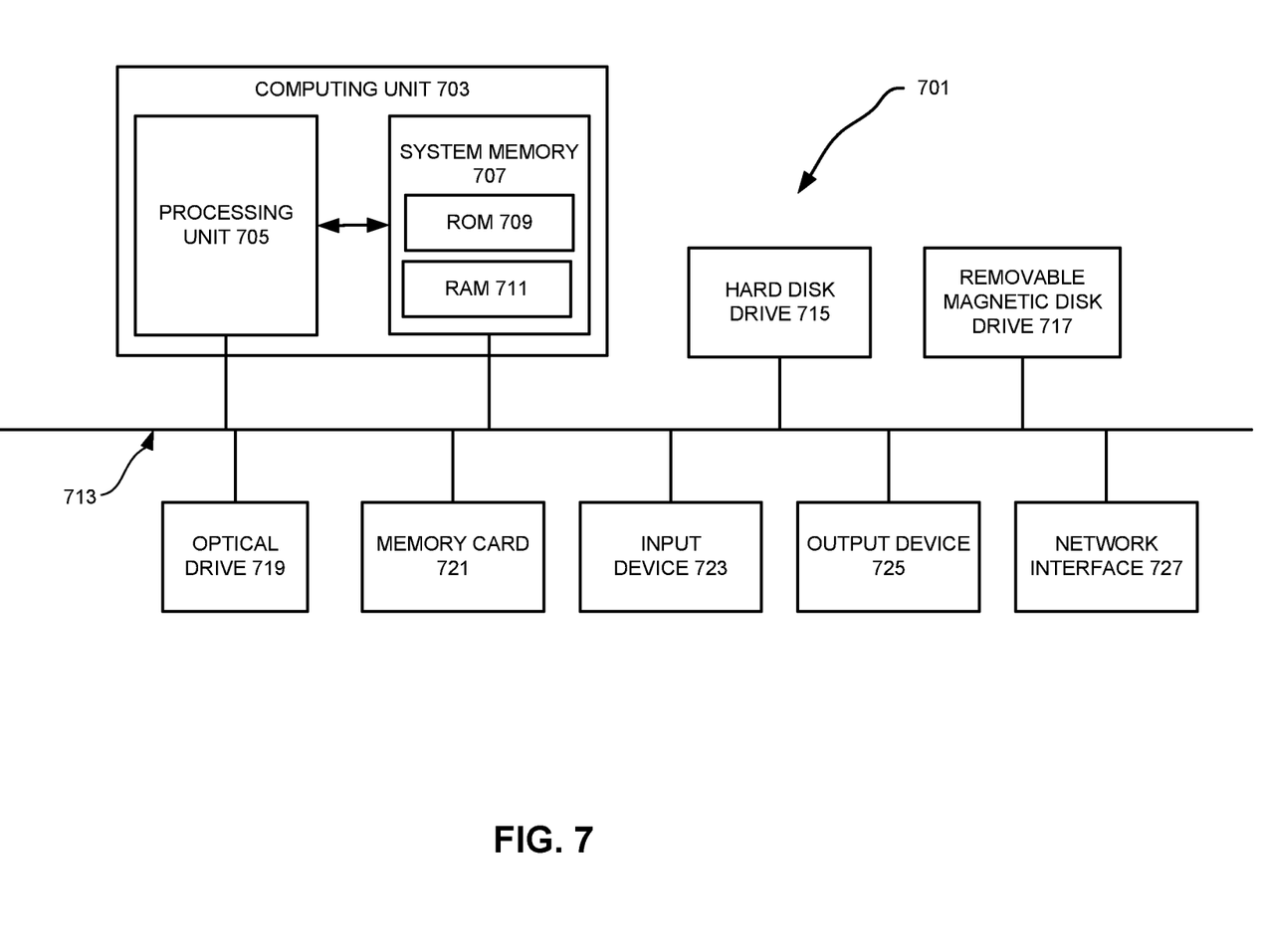
FIG. 7 illustrates a programmable computer system with which various embodiments of the disclosed technology may be employed.

Various examples of the disclosed technology may be implemented through the execution of software instructions by a computing device, such as a programmable computer. For example, the computing device may be caused to perform a method for creating scan chains comprising bidirectional scan cells in a circuit design for testing a chip fabricated according to the circuit design. Accordingly, FIG. 7 shows an illustrative example of a computing device 701. As seen in this figure, the computing device 701 includes a computing unit 703 with a processing unit 705 and a system memory 707. The processing unit 705 may be any type of programmable electronic device for executing software instructions, but it will conventionally be a microprocessor. The system memory 707 may include both a read-only memory (ROM) 709 and a random access memory (RAM) 711. As will be appreciated by those of ordinary skill in the art, both the read-only memory (ROM) 709 and the random access memory (RAM) 711 may store software instructions for execution by the processing unit 705.

The processing unit 705 and the system memory 707 are connected, either directly or indirectly, through a bus 713 or alternate communication structure, to one or more peripheral devices. For example, the processing unit 705 or the system memory 707 may be directly or indirectly connected to one or more additional memory storage devices, such as a "hard" magnetic disk drive 715, a removable magnetic disk drive 717, an optical disk drive 719, or a flash memory card 721. The processing unit 705 and the system memory 707 also may be directly or indirectly connected to one or more input devices 723 and one or more output devices 725. The input devices 723 may include, for example, a keyboard, a pointing device (such as a mouse, touchpad, stylus, trackball, or joystick), a scanner, a camera, and a microphone. The output devices 725 may include, for example, a monitor display, a printer and speakers. With various examples of the computer 701, one or more of the peripheral devices 715-725 may be internally housed with the computing unit 703. Alternately, one or more of the peripheral devices 715-725 may be external to the housing for the computing unit 703 and connected to the bus 713 through, for example, a Universal Serial Bus (USB) connection.

With some implementations, the computing unit 703 may be directly or indirectly connected to one or more network interfaces 727 for communicating with other devices making up a network. The network interface 727 translates data and control signals from the computing unit 703 into network messages according to one or more communication protocols, such as the transmission control protocol (TCP) and the Internet protocol (IP). Also, the interface 727 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 701 is illustrated as an example only, and it is not intended to be limiting. Various embodiments of the disclosed technology may be implemented using one or more computing devices that include the components of the computer 701 illustrated in FIG. 7, which include only a subset of the components illustrated in FIG. 7, or which include an alternate combination of components, including components that are not shown in FIG. 7. For example, various embodiments of the disclosed technology may be implemented using a multiprocessor computer, a plurality of single and/or multiprocessor computers arranged into a network, or some combination of both.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
   a plurality of scan chains comprising bidirectional scan cells, each of the bidirectional scan cells comprising two serial input-output ports serving as either a serial data input port or a serial data output port based on a control signal, each of the plurality of scan chains configured to perform a shift operation in either a first direction or a second direction based on the control signal, the first direction being opposite to the second direction.

2. The circuit recited in claim 1, wherein each of the bidirectional scan cells further comprises two tri-state buffers, outputs of the two tri-state buffers coupled to the two serial input-output ports of the each of the bidirectional scan cells, respectively, and the two tri-state buffers controlled by the control signal and inversion of the control signal, respectively.

3. The circuit recited in claim 2, wherein the two tri-state buffers are in a demultiplexer.

4. The circuit recited in claim 2, wherein each of the scan cells further comprises a multiplexer, two inputs of the multiplexer coupled to outputs of the two tri-state buffers, respectively.

5. The circuit recited in claim 2, wherein each of the scan cells further comprises a conventional scan cell, a serial output of the conventional scan cell is coupled to inputs of the two tri-state buffers.

6. The circuit recited in claim 1, wherein each of the scan cells further comprises a multiplexer and a demultiplexer, two outputs of the demultiplexer coupled to the two serial input-output ports, respectively, and two inputs of the multiplexer coupled to the two serial input-output ports, respectively.

7. The circuit recited in claim 1, wherein each of the scan cells further comprises a first pair of tri-state buffers and a second pair of tri-state buffers controlled by the control signal and inversion of the control signal, respectively, an output of one tri-state buffer in the first pair of tri-state buffers coupled to one of the two serial input-output ports, an output of one tri-state buffer in the second pair of tri-state buffers coupled to another one of the two serial input-output ports.

8. One or more non-transitory computer-readable media storing computer-executable instructions for causing a computer to perform a method, the method comprising:
creating a plurality of scan chains in a circuit design for testing a chip fabricated according to the circuit design, the plurality of scan chains comprising:
bidirectional scan cells, each of the bidirectional scan cells comprising two serial input-output ports serving as either a serial data input port or a serial data output port based on a control signal, each of the plurality of scan chains configured to perform a shift operation in either a first direction or a second direction based on the control signal, the first direction being opposite to the second direction.

9. The one or more non-transitory computer-readable media recited in claim 8, wherein each of the bidirectional scan cells further comprises two tri-state buffers, outputs of the two tri-state buffers coupled to the two serial input-output ports of the each of the bidirectional scan cells, respectively, and the two tri-state buffers controlled by the control signal and inversion of the control signal, respectively.

10. The one or more non-transitory computer-readable media recited in claim 9, wherein the two tri-state buffers are in a demultiplexer.

11. The one or more non-transitory computer-readable media recited in claim 9, wherein each of the scan cells further comprises a multiplexer, two inputs of the multiplexer coupled to outputs of the two tri-state buffers, respectively.

12. The one or more non-transitory computer-readable media recited in claim 9, wherein each of the scan cells further comprises a conventional scan cell, a serial output of the conventional scan cell is coupled to inputs of the two tri-state buffers.

13. The one or more non-transitory computer-readable media recited in claim 8, wherein each of the scan cells further comprises a multiplexer and a demultiplexer, two outputs of the demultiplexer coupled to the two serial input-output ports, respectively, and two inputs of the multiplexer coupled to the two serial input-output ports, respectively.

14. The one or more non-transitory computer-readable media recited in claim 8, wherein each of the scan cells further comprises a first pair of tri-state buffers and a second pair of tri-state buffers controlled by the control signal and inversion of the control signal, respectively, an output of one tri-state buffer in the first pair of tri-state buffers coupled to one of the two serial input-output ports, an output of one tri-state buffer in the second pair of tri-state buffers coupled to another one of the two serial input-output ports.

15. A bidirectional scan cell, comprising:
two serial input-output ports serving as either a serial data input port or a serial data output port based on a control signal;
two tri-state buffers, outputs of the two tri-state buffers coupled to the two serial input-output ports, respectively, the two tri-state buffers controlled by the control signal and inversion of the control signal, respectively; and
a state element, an output of the state element coupled to inputs of the two tri-state buffers.

16. The bidirectional scan cell in claim 15, wherein the two tri-state buffers are in a demultiplexer.

17. The bidirectional scan cell in claim 15, further comprising:
a multiplexer, two inputs of the multiplexer coupled to outputs of the two tri-state buffers, respectively.

18. The bidirectional scan cell in claim 15, further comprising:
two additional tri-state buffers, inputs of the two additional tri-state buffers coupled to the two serial input-output ports, respectively, the additional two tri-state buffers controlled by the control signal and inversion of the control signal, respectively.

19. The bidirectional scan cell in claim 15, wherein the state element is a flip-flop.

* * * * *